US009058880B2

(12) United States Patent
Ueng et al.

(10) Patent No.: US 9,058,880 B2
(45) Date of Patent: Jun. 16, 2015

(54) UNEQUAL BIT RELIABILITY INFORMATION STORAGE METHOD FOR COMMUNICATION AND STORAGE SYSTEMS

(71) Applicant: National Tsing Hua Univesity, Hsinchu (TW)

(72) Inventors: Yeong-Luh Ueng, Kinmen County (TW); Chia-Hsiang Yang, Kinmen County (TW); Mao Ruei Li, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 140 days.

(21) Appl. No.: 13/758,191

(22) Filed: Feb. 4, 2013

(65) Prior Publication Data

US 2014/0223261 A1    Aug. 7, 2014

(51) Int. Cl.
G11C 29/00 (2006.01)
G11C 16/10 (2006.01)
G06F 11/00 (2006.01)
G11C 11/56 (2006.01)

(52) U.S. Cl.
CPC ................ *G11C 16/10* (2013.01); *G06F 11/00* (2013.01); *G11C 11/5642* (2013.01)

(58) Field of Classification Search
CPC .................................................. H03M 13/1111
USPC ........................................... 714/780, 752, 805
See application file for complete search history.

(56) References Cited

U.S. PATENT DOCUMENTS

| 4,788,656 | A  | * | 11/1988 | Sternberger ..................... 710/52 |
| 6,449,214 | B1 | * | 9/2002 | Carr et al. ..................... 365/236 |
| 7,516,372 | B2 | * | 4/2009 | Wilkes ........................... 714/54 |
| 7,580,967 | B2 | * | 8/2009 | Tessarolo et al. ............. 708/552 |
| 8,004,521 | B2 | * | 8/2011 | Falchetto ....................... 345/422 |
| 8,059,456 | B2 | * | 11/2011 | Shlick et al. ............. 365/185.03 |
| 8,433,980 | B2 | * | 4/2013 | Alrod et al. ................... 714/773 |
| 8,498,146 | B2 | * | 7/2013 | Sekar et al. ................... 365/163 |
| 8,788,919 | B2 | * | 7/2014 | Zhao et al. .................... 714/790 |
| 2012/0221775 | A1 | * | 8/2012 | Kim et al. ..................... 711/103 |
| 2013/0326116 | A1 | * | 12/2013 | Goss et al. .................... 711/103 |

* cited by examiner

*Primary Examiner* — Esaw Abraham
(74) *Attorney, Agent, or Firm* — Jackson IPG PLLC; Demian K. Jackson

(57) ABSTRACT

An unequal bit-reliability information storage method for communication and storage systems at least includes one storage unit having a first memory and a second memory; the most significant information bits are stored in the first memory; and least significant information bits are stored in the second memory. Based on the significance of each bit of the information with the use of the first or second memories of different reliability for storage, the complexity of the storage unit, the production cost and the power consumption can be reduced while maintaining the performance.

1 Claim, 4 Drawing Sheets

UNEQUAL BIT RELIABILITY INFORMATION STORAGE METHOD FOR COMMUNICATION AND STORAGE SYSTEMS

BACKGROUND OF THE INVENTION

1. Field of the Invention

The present invention relates to an unequal bit-reliability information storage method for communication and storage systems. Based on the significance of each bit of the information, the storage memory with different reliability is used. The production cost and the power consumption are therefore reduced.

2. Description of Related Art

The Receiver side (reader side) of a modern digital communication (data storage) system needs to store a lot of information (encoded by bits). Theoretically, more bits represent more information, thereby improving the error performance of the system.

Each bit has a different weight in the digital system, but the same type of storage unit is used for all bits. This results in extra area and power consumption. As the increased storage size in the modern system, this situation becomes even worse. For example, the storage memory in a low-density parity-check (LDPC) decoder occupies at least the half of the overall chip area.

For this reason, the inventors have studied and proceeded in-depth discussion, and actively seek approaches for many years. After long-term research and efforts in development, the inventors have finally developed this invention "an unequal bit-reliability information storage method for communication and storage systems" which overcomes the shortage in the prior art.

SUMMARY OF THE INVENTION

The purpose of this invention is to provide an unequal bit-reliability information storage method for communication and storage systems, based on the significance of each bit. Several memories with different reliability for storage are used to reduce the production cost and the power consumption while maintaining the performance.

In order to achieve the above objective, the invented unequal bit-reliability information storage method for communication and storage systems at least includes the first memory and the second memory. The most significant information bits are stored in the first memory and the least significant information bits are stored in the second memory.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
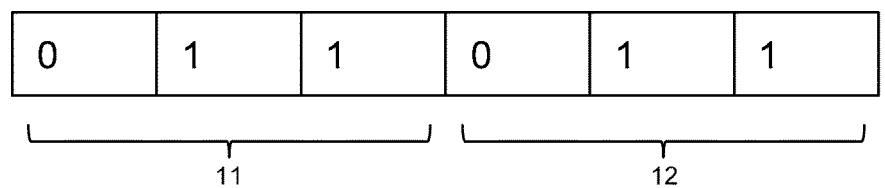
FIG. 1 is a schematic view of an unequal bit-reliability information storage method according to the invention.
Figure 2:
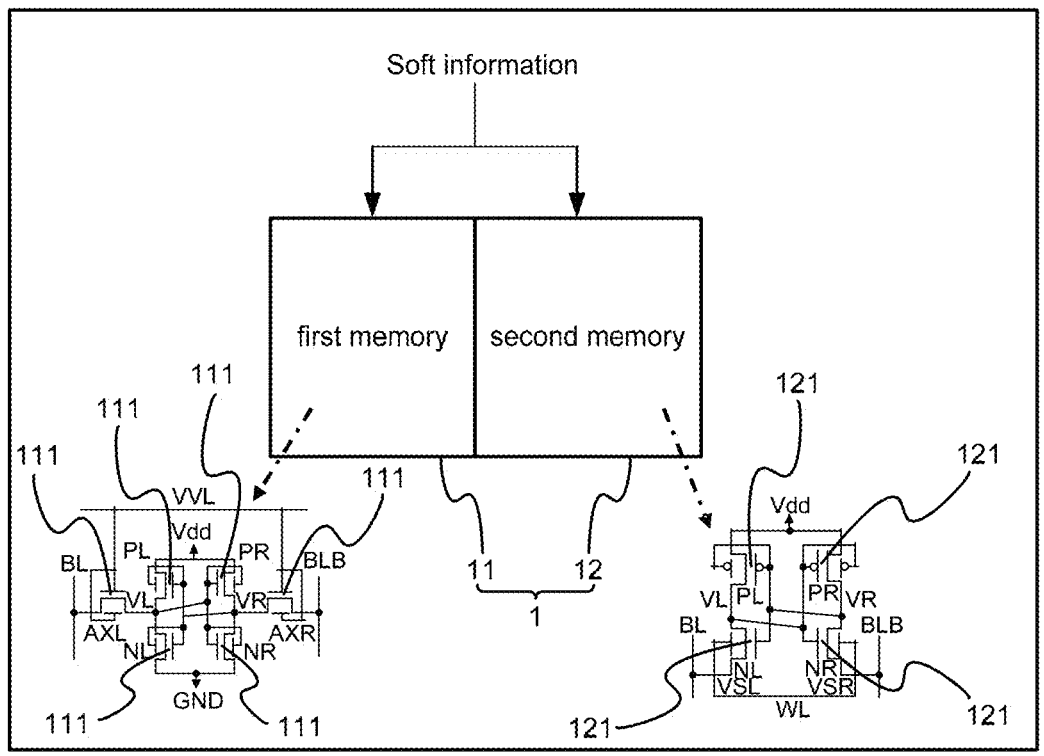
FIG. 2 is a schematic view of a fundamental configuration of an unequal bit-reliability information storage method for the purpose of saving area according to the invention.
Figure 3:
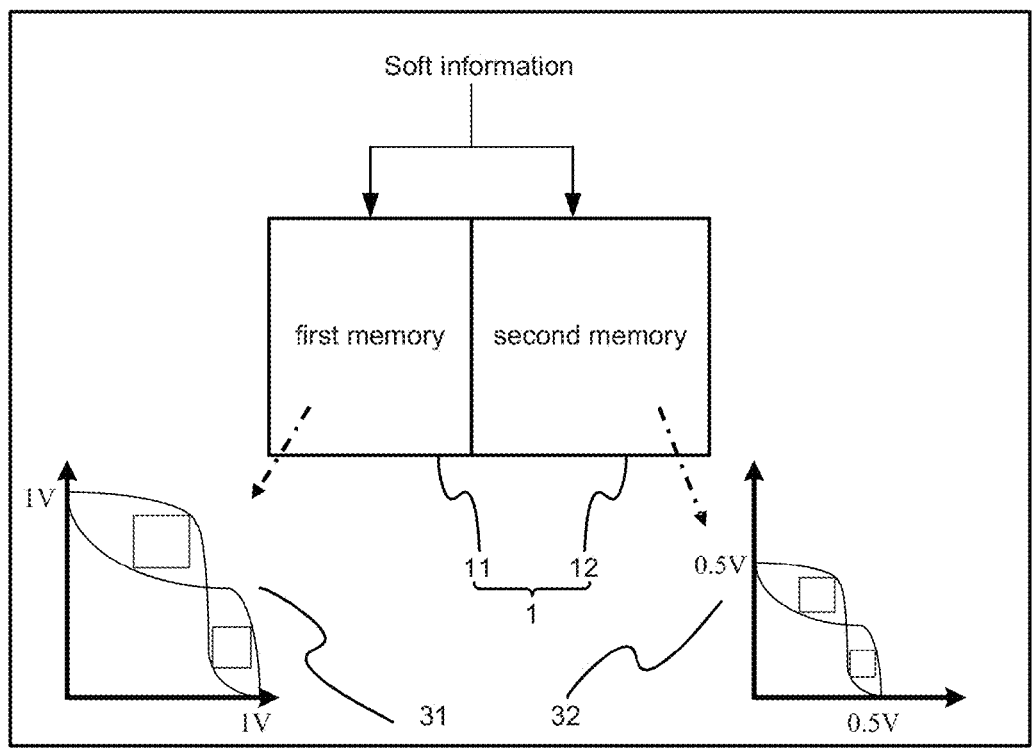
FIG. 3 is a schematic view of a fundamental configuration of an unequal bit-reliability-information storage method for the purpose of saving power according to the invention.
Figure 4:
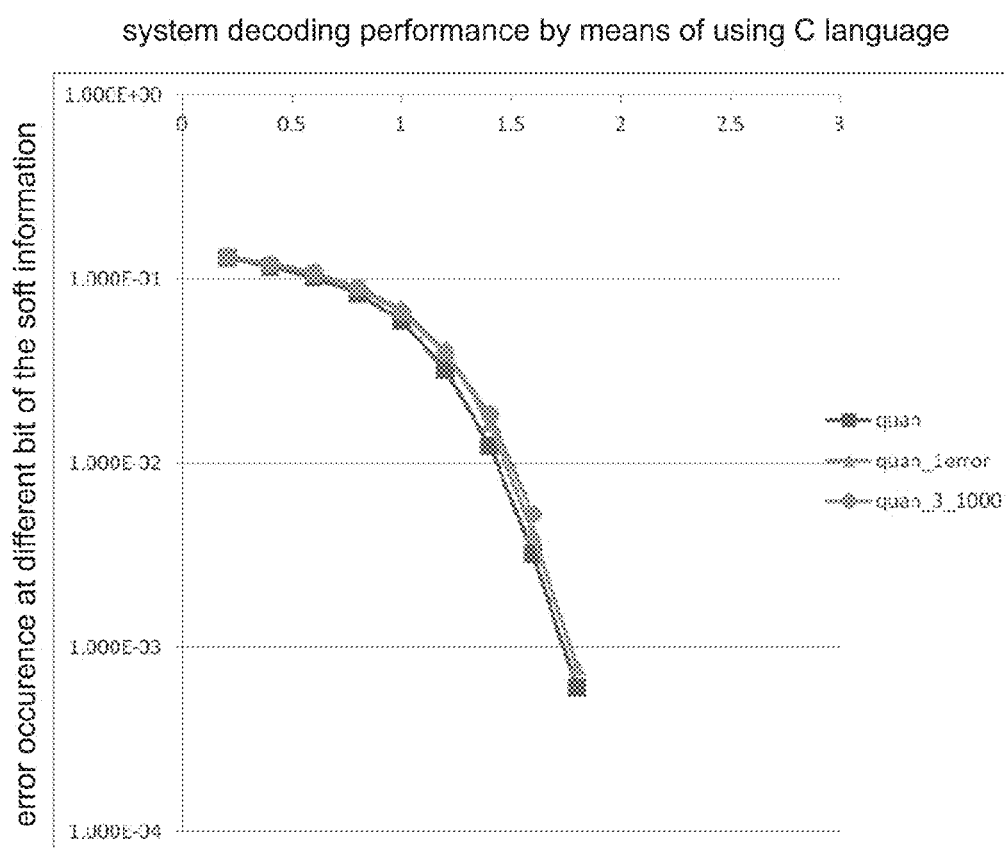
FIG. 4 illustrates the relation between the error performance and the operating condition in the C language according to the invention.

FIG. 1 is a schematic view of an unequal bit-reliability information storage method according to the invention. FIG. 2 is a schematic view of a fundamental configuration of an unequal bit-reliability information storage method for the purpose of saving area according to the invention. FIG. 3 is a schematic view of a fundamental configuration of an unequal bit-reliability information storage method for the purpose of saving power according to the invention. FIG. 4 illustrates the relation between the error performance and the operating condition in the C language according to the invention. The unequal bit-reliability information storage method according to the invention at least includes one storage unit 1 having multiple memories. The storage unit 1 at least includes a first memory 11 and a second memory 12. Based on the importance of the information, memories with different reliability are placed in order to reduce storage area and power. The significant information bits are stored in the first memory 11 and the remaining information bits are stored in the second memory 12 (as shown in FIG. 2). The first and second memories 11, 12 can be realized by any memory elements, such as static random access memory (SRAM), dynamic random access memory (DRAM), etc. In addition, different operating conditions (such as supply voltage and bias current) can be applied to the first and second memories 11 and 12 in order to achieve the purpose of reducing power.

In one embodiment of the invention, a decoder using Low-Density Parity-Check Code (LDPC Code) is used for illustration, but not intended to limit to the scope of the present invention. The same concept can also be applied to other communication or storage systems.

Referring to FIG. 1, the information is divided into the most significant bits (MSBs) and with least significant bits (LSBs). MSBs and LSBs are stored in the first memory 11 and the second memory 12, respectively. An LDPC decoder offers unique characteristics required for each information in terms of reliability. In such a decoder, if only few errors occur, particularly in the LSBs, the memory deployment has negligible impact on the decoding performance.

As shown in FIG. 2, the first memory 11 and the second memory 12 are implemented by different memory cells. The first memory 11 uses 6T SRAM cell. In order to reduce the area, the second memory 12 uses 4T SRAM cell as a storage unit. Compared to the first memory, the second memory 12 has less lower storage area. 4T, 6T SRAM, are shown as example, but are not limited thereto, and may also be other storage units.

The embodiment as shown in FIG. 3 is to achieve the purpose of saving power consumption. The first memory 11 and the second memory 12 may use the same or different memory units, but they work at different operating conditions. According to the embodiment as shown in FIG. 3, in order to operate the memory 11 at a more stable condition, a higher supply voltage is applied. While the second memory 12 operate at a lower supply voltage to reduce power. As shown, the butterfly curve 31 of the first memory indicates a larger noise margin, resulting in fewer errors during operation.

In summary, the invention needs smaller storage area and less power consumption with comparable decoding performance compared to the prior art.

FIG. 4 illustrates the relation between the error performance and the operating condition in the C language according to invention. As shown, "quan" indicates the performance of the conventional storage using 5-bit. "quan_1error" indicates the performance of the invented storage method, in which only one LSB is stored in a less reliable cell. "quan_3_1000" indicates the performance of the invented storage method, in which three LSBs are stored in less reliable cells. The result shows that even few errors occur in LSB, The performance degradation is negligible.

Thus, the invention proposes an unequal bit-reliability information storage method for communication or storage systems. LSBs are stored in the less reliable memory (second memory 12 in the previous discussion). In a conventional information storage method, each bit of the information uses the same type of memory unit as a storage medium, consuming a lot of storage area and power. However, in the unequal bit-reliability information storage method according to the invention, more memories with different reliabilities can be used based on the significance of each bit to reduce the storage area and power while maintaining the overall performance of the system.

In summary, the unequal bit-reliability information storage method for communication or storage systems according to the present invention can effectively improve the shortcomings of prior art. Based on the significance of each bit of the soft information with the use of the first or second memories of different reliability for storage, the storage area and the power consumption can be reduced. This makes the invention more progressive and more practical in use which complies with the patent law.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An unequal bit-reliability storage system comprising:
first six transistor (6T) static random access memory (SRAM) operating at a first, higher supply voltage so as to provide a larger noise margin and
second four transistor (4T) SRAM operating at a second, lower supply voltage so as to provide a lower noise margin and reduced storage area, wherein incoming information is divided such that more significant bits are stored in the first memory.

\* \* \* \* \*